US012689337B2

(12) United States Patent
Chuang et al.

(10) Patent No.: US 12,689,337 B2
(45) Date of Patent: Jul. 21, 2026

(54) CLASS-D AMPLIFIER ABLE TO REDUCE POWER NOISE

(71) Applicant: REALTEK SEMICONDUCTOR CORP., Hsinchu (TW)

(72) Inventors: Chia-I Chuang, Hsinchu (TW); Ling-Miao Chou, Hsinchu (TW); Che-Hung Lin, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 460 days.

(21) Appl. No.: 18/237,655

(22) Filed: Aug. 24, 2023

(65) Prior Publication Data

US 2024/0162867 A1    May 16, 2024

(30) Foreign Application Priority Data

Nov. 16, 2022    (TW) .................................. 111143783

(51) Int. Cl.
| | |
|---|---|
| *H03F 3/217* | (2006.01) |
| *H03F 1/02* | (2006.01) |
| *H03F 1/26* | (2006.01) |

(52) U.S. Cl.
CPC ........... *H03F 3/217* (2013.01); *H03F 1/0255* (2013.01); *H03F 1/26* (2013.01)

(58) Field of Classification Search
CPC .. H03F 3/217; H03F 3/45475; H03F 3/45928; H03F 3/187; H03F 3/2173;
(Continued)

(56) References Cited

U.S. PATENT DOCUMENTS

| | | | |
|---|---|---|---|
| 10,027,294 B2 | 7/2018 | Wang | |
| 11,323,082 B2 | 5/2022 | Huang | |
| 2022/0278658 A1* | 9/2022 | Lesso | .................... H03F 1/3258 |

FOREIGN PATENT DOCUMENTS

| | | |
|---|---|---|
| TW | I724979 B | 4/2021 |

OTHER PUBLICATIONS

OA letter of a counterpart TW application (appl. No. 111143783) mailed on Nov. 21, 2023. Summary of the TW OA letter: 1. Claims 1-2, 7-8, and 10 are rejected as being allegedly unpatentable over cited reference 1 (TW I724979 B). 2. Claims 3-6 and 9 are allowable. Correspondence bewteen claims of TW counterpart application and claims of US application: 1. Claims 1-6 and 7-10 in TW counterpart application correspond to claims 1-6 and 10-13 in US application, respectively.

* cited by examiner

*Primary Examiner* — Andrea Lindgren Baltzell
*Assistant Examiner* — Nareh Shamiryan
(74) *Attorney, Agent, or Firm* — WPAT, PC

(57) ABSTRACT

A Class-D amplifier includes a loop filter circuit, a comparator circuitry, an output circuitry, and a common-mode control circuitry. The loop filter circuit generates first and second signals according to input and output signals and adjusts common-mode levels of the first and second signals according to a first common-mode signal. The comparator circuitry respectively compares a ramp signal with the first and second signals to generate pulse signals, and a common-mode level of the ramp signal is set based on a second common-mode signal. The output circuitry is powered by a power supply voltage to generate the output signals according to the pulse signals. The common-mode control circuitry performs an AC-coupling operation on the power supply voltage to generate a noise signal and generate one of the
(Continued)

100 first and second common-mode signals according to the noise signal and another one of the first and second common-mode signals.

16 Claims, 3 Drawing Sheets

(58) Field of Classification Search
CPC . H03F 1/0255; H03F 1/26; H03F 1/30; H03F 2200/459; H03F 2200/03
USPC ........................................................ 330/251
See application file for complete search history.

140

140

CLASS-D AMPLIFIER ABLE TO REDUCE POWER NOISE

BACKGROUND OF THE INVENTION

1. Field of the Invention

The present disclosure relates to a Class-D amplifier. More particularly, the present disclosure relates to a Class-D amplifier that is able to reduce impacts from power noise(s).

2. Description of Related Art

Class-D amplifiers are commonly employed as audio amplifiers. In order to ensure better quality of output audio, the Class-D amplifiers typically require a higher power supply rejection ratio (PSRR). According to exiting existing approaches, low-pass filters are utilized for addressing lower-frequency power supply noise(s) rather than higher-frequency power supply noise(s). Furthermore, power supply noise may not be effectively eliminated due to mismatches in internal circuitry of the Class-D amplifiers. According to alternative related approaches, a voltage control circuit and an integrator with high accuracy and high loop gain are utilized to reduce power supply noise. However, this configuration leads to a noticeable increase in power consumption and circuit area.

SUMMARY OF THE INVENTION

In some aspects, one object of the present disclosure is, but not limited to, to provide a Class-D amplifier able to reduce power noise(s), in order to prevent the problems of the prior art.

In some aspects, a Class-D amplifier includes a loop filter circuit, a comparator circuitry, an output circuitry, and a common-mode control circuitry. The loop filter circuit is configured to generate a first signal according to a first input signal and a first output signal, generate a second signal according to a second input signal and a second output signal, and adjust a common-mode level of each of the first signal and the second signal according to a first common-mode signal. The comparator circuitry is configured to compare the first signal with a ramp signal to generate a first pulse signal, and compare the second signal with the ramp signal to generate a second pulse signal, in which a common-mode level of the ramp signal is set based on a second common-mode signal. The output circuitry is configured to be powered by a power supply voltage to generate the first output signal according to the first pulse signal and to generate the second output signal according to the second pulse signal. The common-mode control circuitry is configured to perform an AC-coupling operation on the power supply voltage to generate a first noise signal and generate a first one of the first common-mode signal and the second common-mode signal according to the first noise signal and a second one of the first common-mode signal and the second common-mode signal.

These and other objectives of the present disclosure will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other. In this document, the term "circuitry" may indicate a single system that is formed with at least one circuit, and the term "circuit" may indicate an object, which is formed with one or more transistors and/or one or more active/passive elements based on a specific arrangement, for processing signals.

As used herein, the term "and/or" includes any and all combinations of one or more of the associated listed items. Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. For ease of understanding, like elements in various figures are designated with the same reference number.

Figure 1:
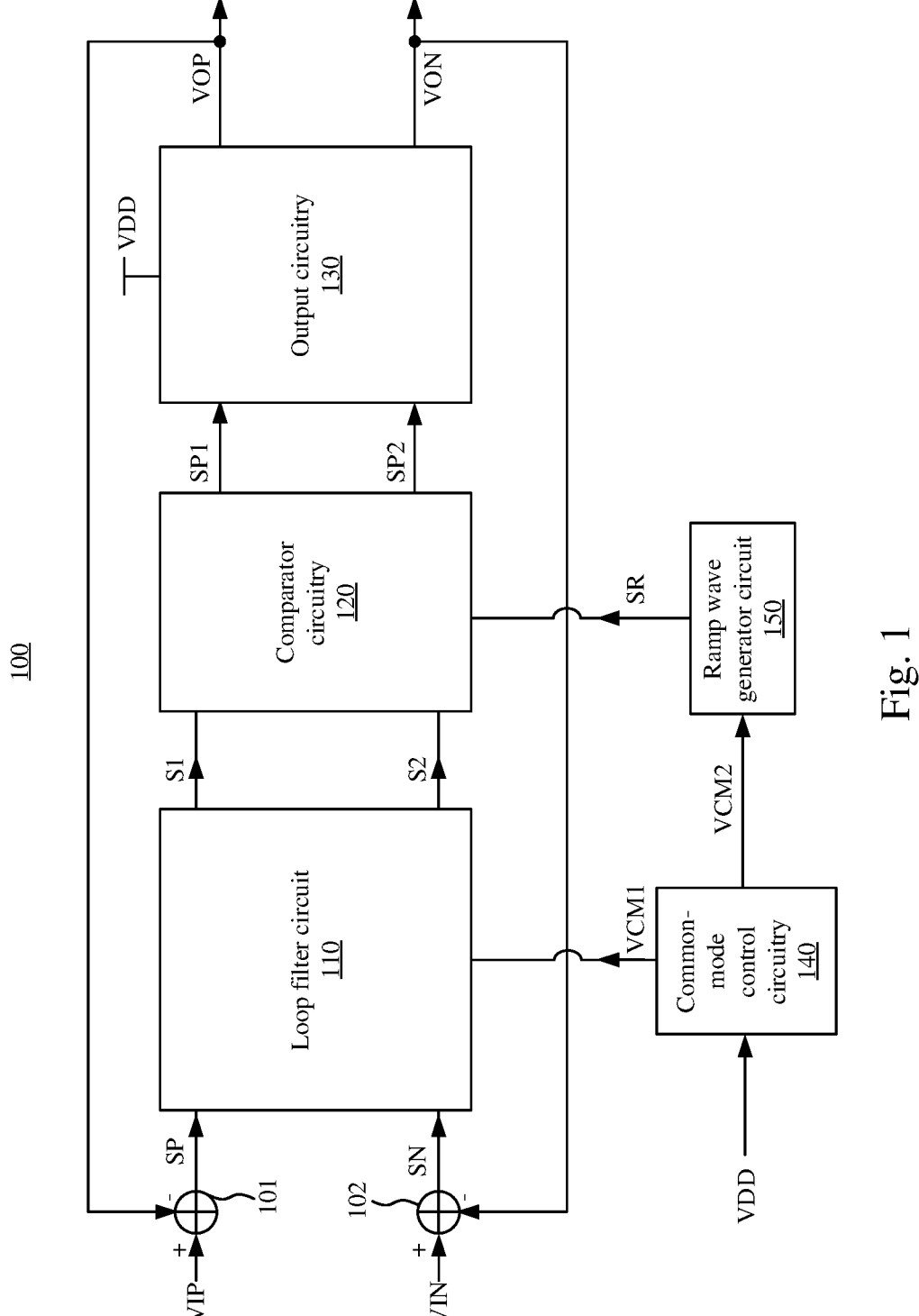
FIG. 1 illustrates a schematic diagram of a Class-D amplifier according to some embodiments of the present disclosure.

FIG. 1 illustrates a schematic diagram of a Class-D amplifier 100 according to some embodiments of the present disclosure. The Class-D amplifier 100 includes a subtractor circuit 101, a subtractor circuit 102, a loop filter circuit 110, a comparator circuitry 120, an output circuitry 130, a common-mode control circuitry 140, and a ramp wave generator circuit 150.

The loop filter circuit 110 generates a signal S1 according to an input signal VIP and an output signal VOP and generates a signal S2 according to an input signal VIN and an output signal VON. In greater detail, the subtractor circuit 101 determines difference (labeled as signal SP) between the input signal VIP and the output signal VOP, and the subtractor circuit 102 determines difference (labeled as signal SN) between the input signal VIN and the output signal VON. The loop filter circuit 110 filters the signal SP and outputs the filtered signal SP as the signal S1. Similarly, the loop filter circuit 110 filters the signal SN and outputs the filtered signal SN as the signal S2.

In some embodiments, the subtractor circuit 101, the subtractor circuit 102, and the loop filter circuit 110 may be integrated into a single circuitry. For example, the loop filter circuit 110 may be an operational amplifier with a feedback network, and each of the subtractor circuit 101 and the subtractor circuit 102 may have a resistor that is coupled to the feedback network. The subtractor circuit 101 may convert the input signal VIP into a current signal, and subtract a current signal corresponding to the output signal VOP from the current signal corresponding to the input signal VIP at a positive input terminal of the operational amplifier, in order to generate the signal SP. Similarly, the subtractor circuit 102 may convert the input signal VIN into a current signal, and subtract a current signal corresponding to the output signal VON from the current signal corresponding to the input signal VIN at a negative input terminal of the operational amplifier, in order to generate the signal SN. Thus, the operational amplifier may generate the signals S1 and S2 according to the signals SP and SN. In some embodiments, the loop filter circuit 110 further adjusts a common-mode level of each of the signals S1 and S2 (e.g., an average voltage level of the signal S1 or the signal S2) according to a common-mode signal VCM1. For example, the common-mode signal VCM1 may be utilized to set an output common-mode level of the aforementioned operational amplifier and/or a ground voltage received by certain components in the feedback network. In some embodiments, the feedback network may be an active/passive network coupled between the input and output terminals of the aforementioned operational amplifier, which is utilized to set frequency response of the loop filter circuit 110 to achieve relevant operations of the filter.

In some embodiments, the comparator circuitry 120 may operate as a pulse width modulation circuitry, in order to convert the signals S1 and S2 into different pulse wave signals. For example, the comparator circuitry 120 may compare the signal S1 with a ramp signal SR to generate a pulse wave signal SP1, and may compare the signal S2 with the ramp signal SR to generate a pulse wave signal SP2, in which a common-mode level of the ramp signal SR may be set based on a common-mode signal VCM2.

The output circuitry 130 is powered by a power supply voltage VDD to generate the output signal VOP according to the pulse signal SP1 and generate the output signal VON according to the pulse signal SP2. In some embodiments, the output circuitry 130 may operate as a full-bridge output stage circuit to differentially drive a load (which may be, as an example but not limited to, a speaker).

The common-mode control circuitry 140 performs an alternating current (AC)-coupling operation on the power supply voltage VDD to generate a noise signal (e.g., a noise signal SN1 in FIG. 2B or FIG. 3) and generates the common-mode signals VCM1 and VCM2. The common-mode control circuitry 140 may generate one of the common-mode signals VCM1 and VCM2 according to the noise signal and another one of the common-mode signals VCM1 and VCM2. Further details of these operations will be described below with reference to FIG. 2B and FIG. 3. The ramp wave generator circuit 150 generates the ramp signal SR and adjusts the common-mode level of the ramp signal SR according to the common-mode signal VCM2. For example, the ramp wave generator circuit 150 may utilize an adder circuit (not shown) to add the common-mode signal VCM2 with a predetermined voltage (which may be an initial value corresponding to the common-mode level of the ramp signal SR), in order to adjust the common-mode level of the ramp signal SR.

With the aforementioned configuration, the common-mode control circuitry 140 is able to extract power supply noise from the power supply voltage VDD and utilize this power supply noise to generate the common-mode signal VCM1 or the common-mode signal VCM2. Consequently, the comparator circuitry 120 may generate the pulse wave signals SP1 and SP2 that each have a correction signal component (which may be equivalent to negative power supply noise) in response to the common-mode signal VCM1 or the common-mode signal VCM2. The correction signal component(s) and the power supply noise in the power supply voltage VDD can be canceled with each other at the output circuitry 130, thereby reducing impact of the power supply noise on the output signals VOP and VON. As a result, power supply rejection ratio of the Class-D amplifier 100 can be enhanced.

Figure 2B:
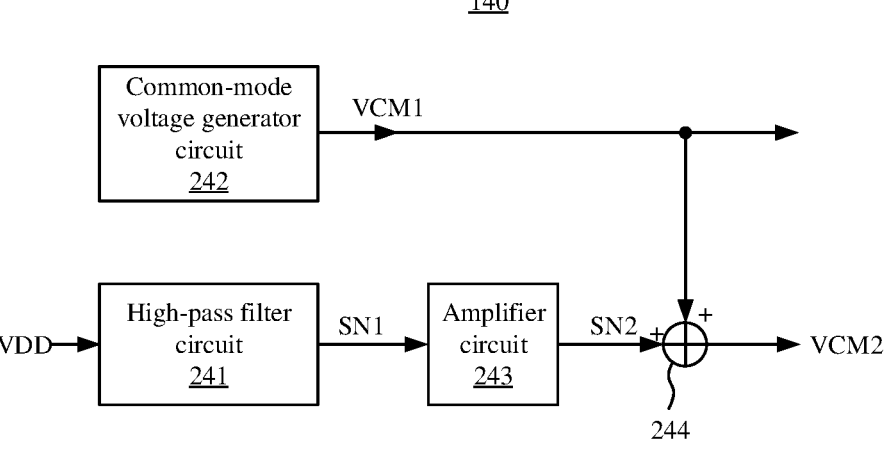
FIG. 2B illustrates a schematic diagram of the common-mode control circuitry in FIG. 2A (or FIG. 1) according to some embodiments of the present disclosure.
Figure 3:
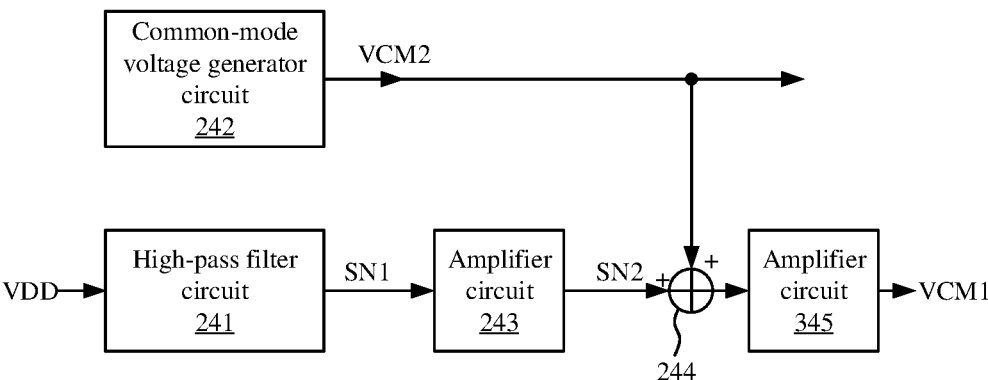
FIG. 3 illustrates a schematic diagram of the common-mode control circuitry in FIG. 2A or FIG. 1 according to some embodiments of the present disclosure.

Explained in a different way, in some embodiments, under ideal conditions (where there is no power supply noise on the power supply voltage VDD), the signals S1 and S2 and the ramp signal SR all have the same common-mode level (e.g., half of a level of the power supply voltage VDD). If the power supply voltage VDD contains power supply noise, the common-mode control circuitry 140 may adjust the common-mode signal VCM2 (as shown in FIG. 2B) or adjust the common-mode signal VCM1 (as shown in FIG. 3) according to the power supply noise, in order to adjust the common-mode level of the ramp signal SR or the common-mode level of the signals S1 and S2. Under this condition, the common-mode level of the signals S1 and S2 will differ from the common-mode level of the ramp signal SR, such that the comparator circuitry 120 is able to generate the pulse wave signals SP1 and SP2 with correction signal component(s) to reduce the impact of the power supply noise on the output signals VOP and VON.

In some relevant approaches, a Class-D amplifier solely utilizes differential characteristics of the output signal(s) to eliminate power supply noise on the load. However, as the output signal is fed back to the input terminal of the Class-D amplifier and is processed by the Class-D amplifier to generate subsequent output signals, any internal circuit mismatch within the Class-D amplifier due to non-ideal factors may result in a mismatched output signal, such that the power supply noise cannot be eliminated effectively by the differential circuit characteristics. Consequently, the power supply rejection ratio of the Class-D amplifier is decreased. Compared with the aforementioned related approaches, in some embodiments of the present disclosure, the power supply noise of the power supply voltage VDD can be processed based on internal circuit setting of the Class-D amplifier 100 (e.g., predetermined gain as mentioned below) to generate the aforementioned correction signal components, in order to reduce the impact of power supply noise on the output signals VOP and VON. As a result, the Class-D amplifier 100 is able to have a higher power supply voltage rejection ratio.

Figure 2A:
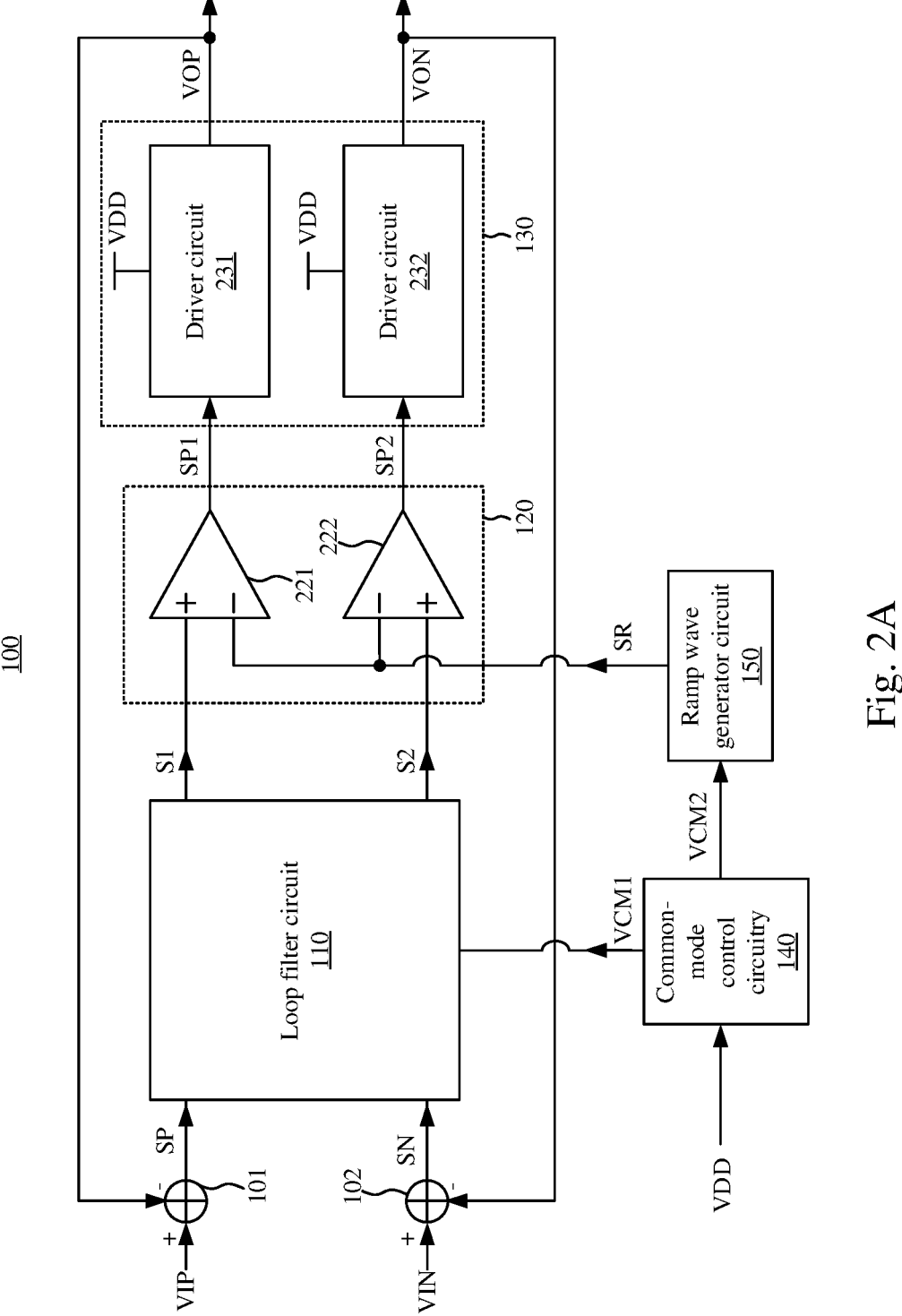
FIG. 2A illustrates a schematic diagram of the Class-D amplifier in FIG. 1 according to some embodiments of the present disclosure.

FIG. 2A illustrates a schematic diagram of the Class-D amplifier 100 in FIG. 1 according to some embodiments of the present disclosure. In this example, the comparator circuitry 120 includes a comparator circuit 221 and a comparator circuit 222. Positive input terminals of the comparator circuits 221 and 222 respectively receive the signals S1 and S2, and a negative input terminal of each of the comparator circuits 221 and 222 receives the ramp signal SR. The comparator circuit 221 compares the signal S1 with the ramp signal SR to generate the pulse signal SP1. For example, when the signal S1 is higher than the ramp signal SR, the comparator circuit 221 generates the pulse signal SP1 having a high level. Alternatively, when the signal S1 is lower than the ramp signal SR, the comparator circuit 221 generates the pulse signal SP1 having a low level. Similarly, the comparator circuit 222 compares the signal S2 with the ramp signal SR to generate the pulse signal SP2.

The output circuitry 130 includes a driver circuit 231 and a driver circuit 232. The driver circuits 231 and 232 are powered by the power supply voltage VDD. The driver circuit 231 generates the output signal VOP according to the pulse signal SP1, and the driver circuit 232 generates the output signal VON according to the pulse signal SP2. As mentioned above, in some embodiments, the output circuitry 130 may operate as a full bridge circuit. For example, each of the driver circuits 231 and 232 may be a half bridge circuit, and the output signals VOP and VON may be differential signals.

FIG. 2B illustrates a schematic diagram of the common-mode control circuitry 140 in FIG. 2A (or FIG. 1) according to some embodiments of the present disclosure. In this example, the common-mode control circuitry 140 generates the noise signal SN1 according to the power supply voltage VDD, and generates the common-mode signal VCM2 according to the noise signal SN1 and the common-mode voltage VCM1.

In greater detail, the common-mode control circuitry 140 includes a high-pass filter circuit 241, a common-mode voltage generator circuit 242, an amplifier circuit 243, and an adder circuit 244. The high-pass filter circuit 241 performs the AC coupling operation on the power supply voltage VDD to generate the noise signal SN1. As a result, the high-pass filter circuit 241 may suppress direct current (DC) frequency components of the power supply voltage VDD and extract AC frequency components (which may be equivalent to the aforementioned power supply noise) as the noise signal SN1. In some embodiments, a cutoff frequency of the high-pass filter circuit 241 may be set to be related to (e.g., close to) a minimum frequency in an audible range of human hearing (e.g., about 20 hertz). Thus, the high-pass filter circuit 241 may attenuate frequency components in the power supply voltage VDD below this minimum frequency and outputs the frequency components in the power supply voltage VDD that are higher than or equal to this minimum frequency as the noise signal SN1.

The common-mode voltage generator circuit 242 is configured to generate the common-mode signal VCM1, in which a level of the common-mode signal VCM1 may be set to, but not limited to, half of the level of the power supply voltage VDD. In some embodiments, the common-mode voltage generator circuit 242 may be, but not limited to, a bandgap reference voltage circuit. The amplifier circuit 243 may adjust the noise signal SN1 based on a predetermined gain to generate the noise signal SN2. The adder circuit 244 adds the noise signal SN2 and the common-mode signal VCM1 to generate the common-mode signal VCM2.

As shown in FIG. 1 or FIG. 2A, the common-mode signals VCM1 and VCM2 generated by the common-mode control circuitry 140 may be utilized to adjust the common-mode level of the inputs of the comparator circuitry 120 (e.g., the signals S1 and S2 and the ramp signal SR), such that the comparator circuitry 120 is able to generate the pulse signals SP1 and SP2 having correction signal component(s), thereby reducing the impact of power supply noise on the outputs of the output circuitry 130 (e.g., the output signals VOP and VON). In order to ensure that the amplitude of the correction signal component is the same as or close to the power supply noise on the output signals VOP and VON, the amplifier circuit 243 may reduce the noise signal SN1 according to a predetermined gain to generate the noise signal SN2, in which the predetermined gain may be determined based on the voltage gain between the outputs of the output circuitry 130 and the inputs of the comparator circuitry 120.

In some embodiments, the predetermined gain may be determined based on an amplification factor between the output signal VOP and the signal S1 (or between the output signal VON and the signal S2). For example, the predetermined gain may be set as a reciprocal of the amplification factor. For instance, if the amplification factor is A, the predetermined gain may be set as 1/A. In some embodiments, the amplification factor may be determined with circuit simulation or measurements, in order to set the predetermined gain of the amplifier circuit 243. As a result, the correction signal component, after being amplified by the comparator circuitry 120 and the output circuitry 130, is allowed to have the amplitude that is similar or close to the power supply noise on the output signals VOP and VON, thereby more effectively eliminating the power supply noise. In other words, in this example, the common-mode control circuitry 140 processes the noise signal SN1 based on the predetermined gain to generate the common-mode signal VCM2 (or VCM1 in the example of FIG. 3), in which the predetermined gain is related to the gain of both the comparator circuitry 120 and the output circuitry 130 (which may be equivalent to the aforementioned amplification factor). For instance, when the gain of both of the comparator circuitry 120 and the output circuitry 130 is higher, the predetermined gain becomes lower.

In this example, the common-mode control circuitry 140 adds the noise signal SN2 with the common-mode signal VCM1 to generate the common-mode signal VCM2, thereby adjusting the common-mode level of the ramp signal SR. As the comparator circuit 221 and the comparator circuit 222 receive the ramp signal SR via the negative input terminals, the noise signal SN2 on the common-mode signal VCM2 may be inversed and amplified respectively by the comparator circuit 221 and the comparator circuit 222 to generate the aforementioned correction signal component. As a result, the power supply noise on the power supply voltage VDD and the correction signal component are canceled with each other at the output circuitry 130, in order to reduce the impact of the power supply noise(s) on the output signals VOP and VON.

FIG. 3 illustrates a schematic diagram of the common-mode control circuitry 140 in FIG. 2A or FIG. 1 according to some embodiments of the present disclosure. In this example, the common-mode control circuitry 140 generates the noise signal SN1 according to the power supply voltage VDD and generates the common-mode signal VCM1 according to the noise signal SN1 and the common-mode voltage VCM2. In other words, different from FIG. 2B, in this example, the common-mode voltage generator circuit 242 may generate the common-mode signal VCM2, and the common-mode control circuitry 140 may add the noise signal SN2 and the common-mode signal VCM2 to generate the common-mode signal VCM1, thereby adjusting the common-mode level of the signals S1 and S2. To ensure that the comparator circuit 221 and the comparator circuit 222 can generate the correction signal component(s) with correct polarity (e.g., negative power supply noise), in this example, the common-mode control circuitry 140 further performs an inversion operation on the sum of the noise signal SN2 and the common-mode signal VCM2 (i.e., the output of the adder circuit 244) to generate the common-mode signal VCM1.

In greater detail, as shown in FIG. 3, the common-mode control circuitry 140 further includes an amplifier circuit 345, which may adjust the sum of the noise signal SN2 and the common-mode signal VCM2 to generate the common-mode signal VCM1. In some embodiments, the gain of the amplifier circuit 345 may be set to be −1, in order to perform the aforementioned inversion operation. In some embodiments, the amplifier circuit 345 may be an inverting buffer. As a result, the inverted noise signal SN2 can be amplified by the comparator circuit 221 and the comparator circuit 222 to generate the aforementioned correction signal components, thereby reducing the impact of the power supply noise on the output signals VOP and VON.

As described above, the Class-D amplifier provided in some embodiments of the present disclosure may extract power supply noise from the power supply voltage and adjust the common-mode level of the internal circuitry of the Class-D amplifier based on the circuit configuration of the Class-D amplifier. As a result, the impact of power supply noise on the output signal can be reduced, resulting in a higher power supply rejection ratio.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

The aforementioned descriptions represent merely some embodiments of the present disclosure, without any intention to limit the scope of the present disclosure thereto. Various equivalent changes, alterations, or modifications based on the claims of present disclosure are all consequently viewed as being embraced by the scope of the present disclosure.

What is claimed is:

1. A Class-D amplifier, comprising:
   a loop filter circuit configured to generate a first signal according to a first input signal and a first output signal, generate a second signal according to a second input signal and a second output signal, and adjust a common-mode level of each of the first signal and the second signal according to a first common-mode signal;
   a comparator circuitry configured to compare the first signal with a ramp signal to generate a first pulse signal, and compare the second signal with the ramp signal to generate a second pulse signal, wherein a common-mode level of the ramp signal is set based on a second common-mode signal;
   an output circuitry configured to be powered by a power supply voltage to generate the first output signal according to the first pulse signal and to generate the second output signal according to the second pulse signal; and
   a common-mode control circuitry configured to perform an AC-coupling operation on the power supply voltage to generate a first noise signal and generate a first one of the first common-mode signal and the second common-mode signal according to the first noise signal and a second one of the first common-mode signal and the second common-mode signal,
   wherein the common-mode control circuitry comprises:
   a high-pass filter circuit configured to perform the AC-coupling operation on the power supply voltage to generate the first noise signal;
   a common-mode voltage generator circuit configured to provide the second one of the first common-mode signal and the second common-mode signal;
   a first amplifier circuit configured to adjust the first noise signal based on a predetermined gain to generate a second noise signal; and
   an adder circuit configured to add the second noise signal and the second one of the first common-mode signal and the second common-mode signal, in order to generate the first one of the first common-mode signal and the second common-mode signal.

2. The Class-D amplifier of claim 1, wherein the common-mode control circuitry is configured to suppress a DC frequency component in the power supply voltage to generate the first noise signal.

3. The Class-D amplifier of claim 1, wherein if the second one of the first common-mode signal and the second common-mode signal is the second common-mode signal, the common-mode control circuitry is further configured to perform an inversion operation on a sum of the second noise signal and the second common-mode signal, in order to generate the first common-mode signal.

4. The Class-D amplifier of claim 1, wherein the predetermined gain is set based on an amplification factor between the first output signal and the first signal.

5. The Class-D amplifier of claim 4, wherein the predetermined gain is a reciprocal of the amplification factor.

6. The Class-D amplifier of claim 1, wherein a cut-off frequency of the high-pass filter circuit is related to a minimum frequency of an audible range of human hearing.

7. The Class-D amplifier of claim 1, wherein if the second one of the first common-mode signal and the second common-mode signal is the second common-mode signal, the common-mode control circuitry further comprises:
   a second amplifier circuit configured to perform an inversion operation on a sum of the second noise signal and the second common-mode signal, in order to generate the first common-mode signal.

8. The Class-D amplifier of claim 7, wherein a gain of the second amplifier circuit is −1.

9. The Class-D amplifier of claim 1, wherein the comparator circuitry comprises a plurality of comparator circuits, the plurality of comparator circuits respectively generate the first pulse signal and the second pulse signal, and a negative input terminal of each of the plurality of comparator circuits receives the ramp signal.

10. The Class-D amplifier of claim 1, further comprising:
   a ramp wave generator circuit configured to generate the ramp signal and adjust the common-mode level of the ramp signal according to the second common-mode signal.

11. The Class-D amplifier of claim 1, wherein the loop filter circuit is configured to generate the first signal according to a difference between the first input signal and the first output signal, and generate the second signal according to a difference between the second input signal and the second output signal.

12. The Class-D amplifier of claim 1, wherein the comparator circuitry is configured to generate the first pulse signal and the second pulse signal that each have a correction signal component in response to the first one of the first common-mode signal and the second common-mode signal, in order to reduce an impact from a power supply noise in the power supply voltage on the first output signal and the second output signal.

13. The Class-D amplifier of claim 1, wherein the comparator circuitry comprises:

a first comparator circuit configured to compare the first signal with the ramp signal to generate the first pulse signal; and a second comparator circuit configured to compare the second signal with the ramp signal to generate the second pulse signal.

14. The Class-D amplifier of claim 1, wherein the output circuitry comprises:

a first driver circuit configured to be powered by the power supply voltage to generate the first output signal according to the first pulse signal; and a second driver circuit configured to be powered by the power supply voltage to generate the second output signal according to the second pulse signal.

15. A Class-D amplifier, comprising:

a loop filter circuit configured to generate a first signal according to a first input signal and a first output signal, generate a second signal according to a second input signal and a second output signal, and adjust a common-mode level of each of the first signal and the second signal according to a first common-mode signal;

a comparator circuitry configured to compare the first signal with a ramp signal to generate a first pulse signal, and compare the second signal with the ramp signal to generate a second pulse signal, wherein a common-mode level of the ramp signal is set based on a second common-mode signal;

an output circuitry configured to be powered by a power supply voltage to generate the first output signal according to the first pulse signal and to generate the second output signal according to the second pulse signal; and a common-mode control circuitry configured to perform an AC-coupling operation on the power supply voltage to generate a first noise signal and generate a first one of the first common-mode signal and the second common-mode signal according to the first noise signal and a second one of the first common-mode signal and the second common-mode signal, wherein the common-mode control circuitry is configured to process the first noise signal according to a predetermined gain to generate the first one of the first common-mode signal and the second common-mode signal, and the predetermined gain is related to a gain of both of the comparator circuitry and the output circuitry.

16. The Class-D amplifier of claim 15, wherein when the gain of both of the comparator circuitry and the output circuitry is higher, the predetermined gain is lower.

* * * * *